United States Patent [19]
McAdams et al.

[11] Patent Number: 6,100,588
[45] Date of Patent: Aug. 8, 2000

[54] MULTIPLE LEVEL CONDUCTOR WORDLINE STRAPPING SCHEME

[75] Inventors: Hugh P. McAdams, McKinney; William Randy McKee, Plano, both of Tex.

[73] Assignee: Texas Instruments Incorporated, Dallas, Tex.

[21] Appl. No.: 08/883,973

[22] Filed: Jun. 27, 1997

Related U.S. Application Data

[60] Provisional application No. 60/020,961, Jun. 28, 1996.

[51] Int. Cl.[7] .......................... H01L 23/48; H01L 23/52; H01L 29/40
[52] U.S. Cl. ...................... 257/758; 257/759; 257/760; 257/774; 257/775; 257/309; 257/315
[58] Field of Search ................................ 257/296, 908, 257/315, 758, 759, 760, 774, 775, 309

[56] References Cited

U.S. PATENT DOCUMENTS

| | | | |
|---|---|---|---|
| 5,055,898 | 10/1991 | Beilstein, Jr. et al. | 257/759 |
| 5,177,027 | 1/1993 | Lowery et al. | 437/41 |
| 5,671,175 | 9/1997 | Liu et al. | 257/296 |
| 5,707,884 | 1/1998 | Fontanna et al. | 257/315 |

*Primary Examiner*—Mahshid Saadat
*Assistant Examiner*—Jesse A. Fenty
*Attorney, Agent, or Firm*—Robert N. Rountree; Richard L. Donaldson

[57] ABSTRACT

A semiconductor memory device includes an array of storage cells, each cell having a transfer transistor with a gate electrode. A separate wordline 32 interconnects the gate electrodes of each row of the storage cells. A first conductive layer includes stripes 38, each stripe overlying a different row of the storage cells and connecting to the wordline and the gate electrodes of the storage cells of a different odd numbered row of the storage cells. An insulator surrounds the stripes of the first conductive layer. A second conductive layer, separated from the stripes of the first conductive layer by the insulator, includes stripes 39, each stripe of the second conductive layer overlying a different even numbered row of storage cells and connecting to the wordline and the gate electrodes of the different even numbered row of storage cells. This arrangement reduces parasitic delay caused by the wordlines in a high density memory and increases the minimum pitch between stripes of any one level of conductor layer.

17 Claims, 2 Drawing Sheets

MULTIPLE LEVEL CONDUCTOR WORDLINE STRAPPING SCHEME

This application claims benefit of prosivional application Ser. No. 60/020,961 filed Jun. 28, 1996.

FIELD OF THE INVENTION

This invention relates to a semiconductor memory device and more particularly to a semiconductor memory device wordline arrangement.

BACKGROUND OF THE INVENTION

Semiconductor memory devices use a metal line in parallel with a polycrystalline silicon wordline to reduce parasitic delay associated with wordline operation. Periodically across the memory array, contacts are made between the metal line and the associated polycrystalline silicon wordline. Because the metal line has a much lower resistivity than the polycrystalline silicon, a time constant for switching the wordline between high and low logic levels is reduced. Thus data reading and writing operations can be run at a faster rate.

As the density of memory devices increases from generation to generation, the trend is to reduce dimensions of the layout rules for cells faster than the reduction of dimensions in peripheral circuits. In a dynamic random access memory (DRAM), the cell structure is being fabricated above the surface of the silicon substrate. This raised cell structure results in an array that is higher above the substrate surface than peripheral circuits of the device. Such a height differential increases the depth of focus (DOF) required by photolithographic equipment, which must also satisfy reduced array geometry and spacing requirements.

In the manufacturing process, the size and the density of particles are major causes of device failures. The ability to reduce the size and the number of particles lags significantly behind the rate of reduction in pitch between lines included in a device.

A problem that arises while designing a memory array is that reduced pitch between lines creates an environment where particles of a size which historically did not cause defects now do cause defects, such as short circuits between adjacent metal lines running along parallel paths.

SUMMARY OF THE INVENTION

The foregoing problems are solved by a semiconductor memory device including an array of storage cells, each cell having a transfer transistor with a gate electrode. A separate wordline interconnects the gate electrodes of all of the transfer transistors for each row of the storage cells. A first conductive layer includes stripes, each stripe overlying a different row of the storage cells and connecting to the wordline and the gate electrodes of the storage cells of a different odd numbered row of the storage cells. An insulator layer overlies the stripes of the first conductive layer. A second conductive layer on top of the insulator layer includes stripes, each stripe of the second conductive layer overlying a different even numbered row of storage cells and connecting to the wordline and the gate electrodes of the different even numbered row of storage cells.

Advantageously this arrangement reduces parasitic delay caused by the wordlines in a high density memory and increase the minimum pitch between stripes of any one level of conductive layer.

BRIEF DESCRIPTION OF THE DRAWINGS

The aforementioned invention may be more fully understood by reading the subsequent detailed description with reference to the drawing wherein.

DETAILED DESCRIPTION

Figure 1:
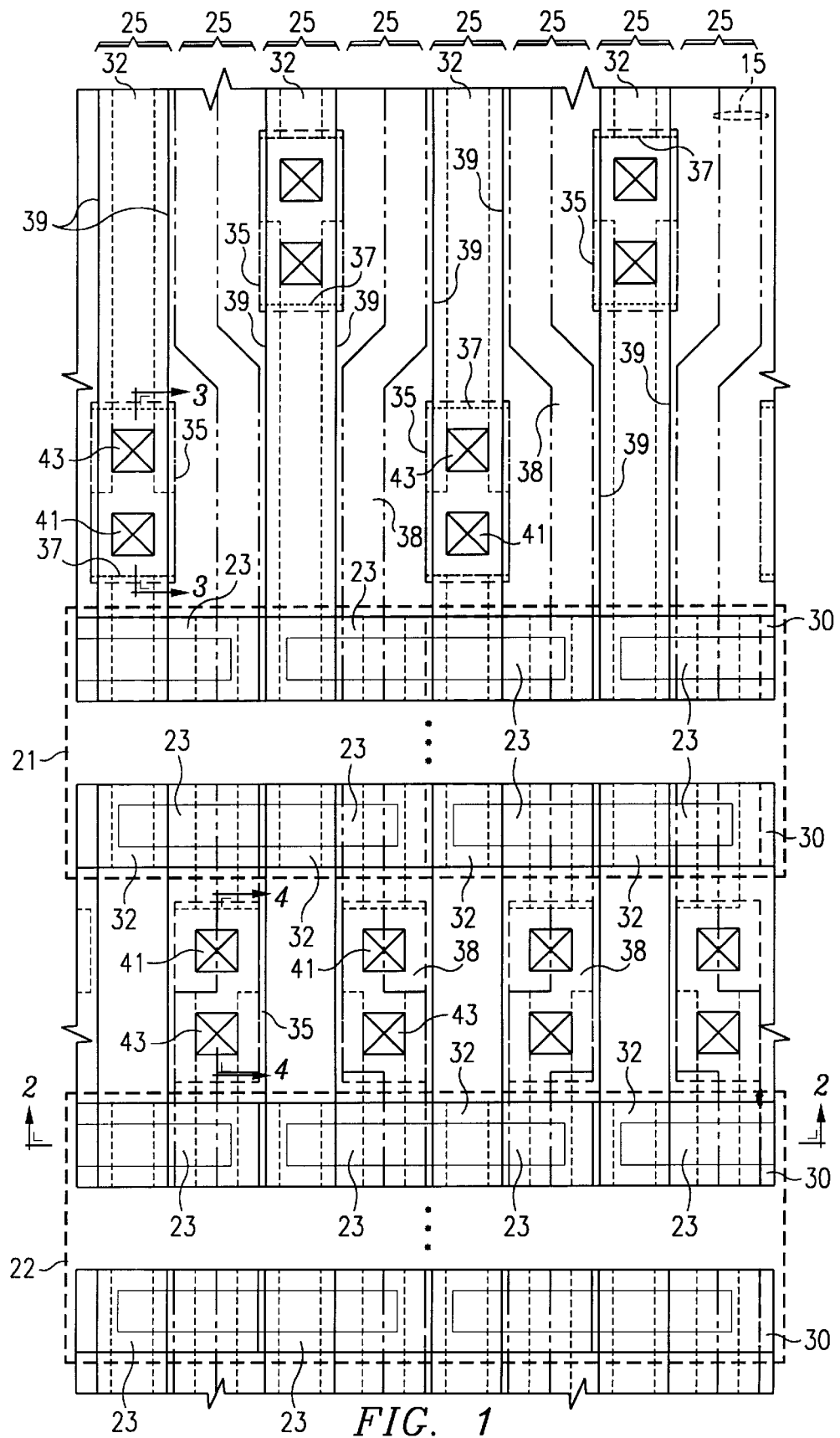
FIG. 1 is a partial plan view of a multi-conductor level layout of wordlines used in an integrated circuit random access memory device.

Referring now to FIG. 1, there is shown a partial plan view of the layout of multiple-level wordlines for accessing rows of storage cells in an integrated circuit random access memory device. Because the storage cells of the memory device are laid out in a repetitive array having addressable wordlines and bitlines, only a small representative section of the layout is presented herein to disclose information, parts of which can be replicated readily for designing a memory device having the advantages of the exemplary arrangement.

In FIG. 1, two exemplary arrays 21 and 22 of storage cells 23 are laid out in regular rows and columns. Each row 25 in each of the exemplary arrays is limited to two storage cells separated by a string of dots depicting many similar storage cells which are omitted to abbreviate the extent of the drawing. The array of storage cells can be expanded by replication of the cells shown in FIG. 1. There are only two partial columns 30 of storage cells 23 shown within the bold dashed lines in each of the arrays. These partial columns 30 can be extended to include many additional storage cells in each column, as desired by the circuit designer.

The storage cells 23 are formed either within a silicon substrate or on the top surface of the silicon substrate. The storage cells include, for example, an MOS transfer transistor and a capacitor arranged as a dynamic memory storage cell. Each multiple-level row line is connected to the gate electrode of each MOS transfer transistor in a separate row of the array.

The layout diagram includes, in light dashed lines, a group of polycrystalline silicon wordlines 32. A group of first conductor-level row line rectangular pads 35 is shown in long dashed and solid lines. A group of second conductor-level row line rectangular pads 37 is shown in short dashed and solid lines. A group of second conductor-level extended row lines 38 is shown as double-dash and solid lines. Also a group of third conductor-level extended row lines 39 is shown as solid lines. Through conductor connections 41 are made between the polycrystalline silicon wordlines and the group of first conductor-level row line rectangular pads 35. Conductor filled vias 43 make connections between the first and second conductor-levels and the second and third conductor-levels.

For the exemplary arrays shown in FIG. 1, a transfer transistor channel region, for each cell, is formed at the top surface of the silicon substrate. A thin gate insulator, for each transfer transistor, is formed on the top surface of the silicon substrate and over the channel region of that transfer transistor. Source and drain electrodes of the transfer transistors also are formed at the surface of the silicon substrate and adjacent opposite sides of the channel region for that transfer transistor. A separate storage capacitor (not shown), associated with the transfer transistor for each of the cells, is typically formed mostly above the surface of the silicon substrate in the individual cell area.

Above the gate insulators of a row of storage cells, a stripe of polycrystalline silicon is formed, as a gate electrode, in contact with the gate insulators of a row of the array of storage cells 23. This stripe of polycrystalline silicon, forming a gate electrode for several transfer transistors, is commonly referred to as the wordline 32 that is used for selecting the storage cells of the row in response to a row address signal identifying that row. The row address signal is preferably produced by a selected row decoder (not shown) responsive to external address and control signals as is well known to those having ordinary skill in the art.

An insulating layer is laid over the stripes of wordlines. Thereafter a first layer of conductive row line rectangular pads 35, which may be a metal or another highly conductive material, is formed over the insulating layer and generally elongated in the same direction as the polycrystalline silicon wordlines. Through openings, formed in the insulating layer, conductive contacts interconnect each conductive row line rectangular pad 35 of the first conductive layer with the polycrystalline silicon wordlines 32.

A second insulating layer is formed between and over the conductive row line rectangular pads 35 of the first conductive layer. A second layer of conductive rectangular pads 37, which may be metallic or another highly conductive material, is formed over the second insulating layer at even-numbered rows. Generally, those pads are elongated in the same direction as the polycrystalline silicon wordlines. Extended row lines 38 of the second conductor-level are formed at odd-numbered rows simultaneously with the pads of the second conductor-level. Conductive vias 43 interconnect each conductive pad 37 and extended row line 38 of the second conductive layer with respective pads of the first conductive layer. Conductive vias also connect the conductive pads 37 to extended row lines 39 of the third conductor-level.

Figure 2:
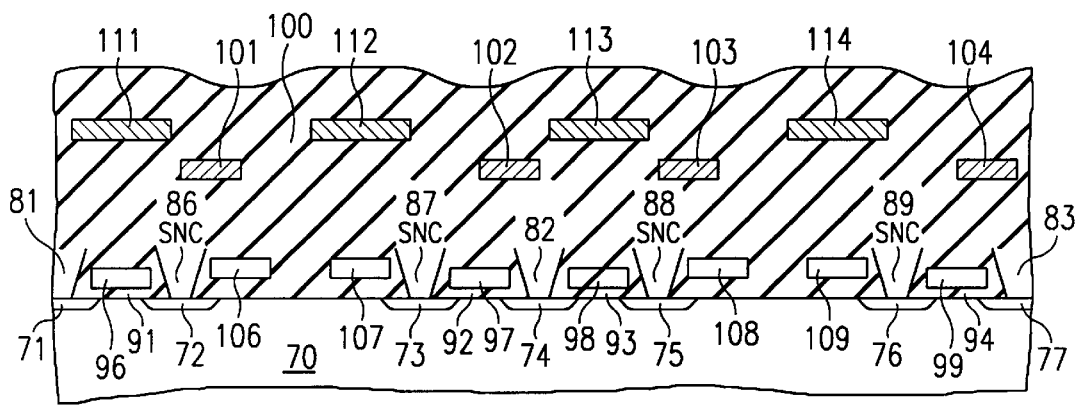
FIG. 2 is a cross-sectional diagram taken at section 2—2 of the plan view of the integrated circuit random access memory device of FIG. 1.

It is noted that in FIG. 1, there is shown one horizontal section line 2—2. FIG. 2 is a cross-section of the partial random access memory device, shown in the plan view of FIG. 1. Additionally in FIG. 1, there are two vertical section lines 3—3 and 4—4. A better understanding of the spatial relationships of various layers of materials in the memory device is possible by reference to the FIGS. 2–4.

Referring now to FIG. 2, there is shown a cross-section of the memory device at the section 2—2 of the plan view of FIG. 1. In FIG. 2, an exemplary silicon semiconductor substrate 70 includes several diffusion regions 71–77. Each one of these diffusion regions is a source/drain electrode of one of a plurality of the transfer MOS transistors. Bitline connections 81, 82 and 83 connect with the source/drain electrodes or diffusion regions 71, 74 and 77. Terminals 86, 87, 88 and 89 of the cell storage capacitors (not shown) connect with the source/drain electrodes or diffusion regions 72, 73, 75 and 76, respectively.

A thin layer of insulating material or layers of insulating material selected from materials, such as silicon dioxide, silicon nitride, or other, lies above the surface of the silicon substrate and between the diffused regions 71–72, 73–74, 74–75 and 76–77. This thin layer of insulating material forms gate insulators 91, 92, 93 and 94 for the MOS transfer transistors.

Wordlines 96, 97, 98 and 99 are formed of conductive material which may be, for example, a polycrystalline silicon stripe having a longitudinal direction perpendicular to the surface of the crosssection of FIG. 2. The wordlines 96, 97, 98 and 99, respectively, overlie the gate insulators 91, 92, 93 and 94 of the MOS transfer transistors. At the MOS transfer transistors the wordlines form the gate electrodes for the transistors of a row of storage cells.

A thicker layer of insulating material or layers of insulating material is laid above the surface of the silicon substrate and between the diffused regions 72–73 and 75–76. At the cross-sections where the MOS transfer transistors are positioned, this layer of insulating material is thinner and becomes gate insulator for those transistors. Wordlines 106, 107, 108 and 109 are formed of conductive material stripe having a longitudinal direction perpendicular to the surface of the cross-section of FIG. 2. These wordlines 106, 107, 108 and 109 also form gate electrodes for the MOS transfer transistors of a row of storage cells.

An insulator 100 or layers of insulating material covers the wordlines and surrounds the connections 81, 82, 83, 86, 87, 88 and 89. A thick layer of insulating material lies over the wordlines and around the connections.

Although it does not appear in the cross-section of FIG. 2, there is a first layer of conductive material in the device. This first layer of conductive material is to be described in greater detail hereinafter. This layer is separated from the wordlines and from second and third layers of conductive material by the insulator 100.

The second layer of conductive material lies in stripes 101, 102, 103 and 104 associated with odd-numbered rows and having a longitudinal direction that is perpendicular to the surface of the cross-section of FIG. 2. These conductive stripes 101, 102, 103 and 104 form the second conductive layer that is laid out in the plan view of FIG. 1. Insulating material fills the space between the stripes of the second conductive layer. The conductive material may be a layer of metallic material, such as aluminum. Insulative material covers the second layer of conductive material.

The third layer of conductive material lies in stripes 111, 112, 113 and 114 associated with even-numbered rows also having a longitudinal direction perpendicular to the surface of the cross-section of FIG. 2. This third conductive layer lies over the insulation covering the second conductive layer.

It is noted that the spaces between the stripes of the second layer and between the stripes of the, third layer of conductive materials equal or exceed the widths of the respective stripes of conductive material. Given the restriction in the total width of the subject memory device, these spaces between the conductive stripes are greater than spaces which would be needed if all of the conductive stripes were placed in a single conductive layer. Thus, there is an advantage in the use of the multiple conductor layers because the extra pitch or width plus space of the conductive stripes results in fewer faults between stripes in the same layer caused by manufacturing imperfections left in the device.

Figure 3:
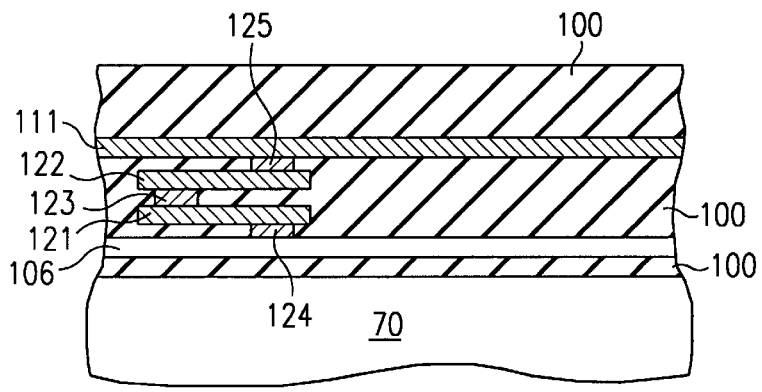
FIG. 3 is a cross-sectional diagram for an even numbered row taken at section 3—3 of FIG. 1.

Referring now to FIG. 3, there is shown a cross-section 3—3 of an even-numbered row of FIG. 1. The wordline stripe 106 of polycrystalline silicon is shown separated from the silicon substrate 70 by the insulator 100. The conductive pad 121 is connected to the wordline stripe 106 by the connector 124. Conductive pads 121 and 122 are interconnected by via 123. The conductive stripe 111 is connected with the conductive pad 122 by via 125. Thus, the wordline stripe 106 is connected by way of conductive material to the conductive stripe 111 of the third layer of the conductive layers. An advantage is that the conductive stripe 111 is run parallel to the direction of the wordline stripe 106 and provides a lower resistance path than the wordline itself. A further advantage is that the conductive stripes of the third layer of conductive layers are substantially separated from one another to avoid crippling fabrication defect problems.

Figure 4:
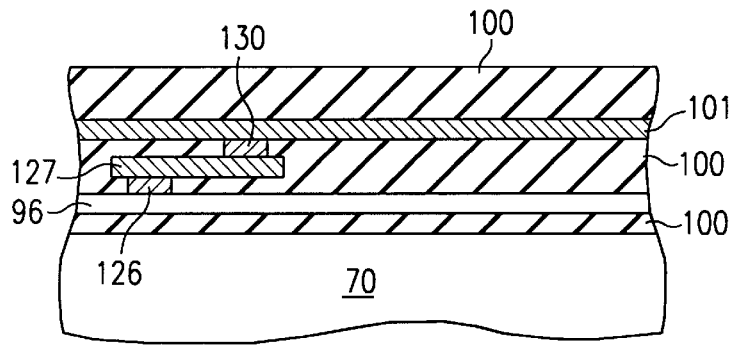
FIG. 4 is a cross-sectional diagram for an odd numbered row taken at section 4—4 of the plan view of FIG. 1.

Referring now to FIG. 4, there is shown a cross-section 4—4 of FIG. 1. The wordline stripe 96 of polycrystalline silicon is shown separated from the silicon substrate 70 by the insulator 100. The conductive pad 127 is connected to the wordline stripe 96 by the connector 126. The conductive stripe 101 is connected with the conductive pad 127 by via 130. Thus, the wordline stripe 96 is connected by way of conductive material to the conductive stripe 101 of the second layer of the conductive layers. Advantageously, the conductive stripe 101 runs effectively parallel to the direction of the wordline stripe 96 and provides a reduced resistance. It is also advantageous that the conductive stripes of the second layer of conductive layers are substantially separated from each other and thereby avoid inclusion of crippling defects during fabrication.

Although embodiments of the invention have been described in detail with reference to preferred embodiments, it is to be understood that the foregoing description is by way of example only and is not to be construed in a limiting sense. For example, the multiple level strapping scheme of the instant invention might well be applied to segmented wordline designs where a master wordline and an address signal enable individual selection circuits for selectively activating a portion of a row of memory cells. Moreover, the multiple level strapping scheme of the instant invention might well be applied to bitlines or other interconnect where improved reliability and layout efficiency are desired.

An embodiment of a memory device has been described. Such embodiment and others made obvious in view thereof are considered to be covered by the appended claims.

What is claimed is:

1. A semiconductor memory device comprising:
   an array of storage cells arranged in rows and columns, each storage cell including a transfer transistor having a gate electrode, each row of storage cells having a respective wordline interconnecting the gate electrodes of the row, each said respective wordline having a wordline pitch;
   a first insulator layer overlying each said respective wordline and gate electrodes;
   a first conductive layer including a first plurality of conductive stripes, each conductive stripe of the first conductive layer overlying the first insulator layer and a respective odd numbered row of the storage cells and connecting to the wordline interconnecting the gate electrodes of the respective odd numbered row;
   a second insulator overlying the first plurality of conductive stripes; and
   a second conductive layer overlying the second insulator, the second conductive layer including a second plurality of conductive stripes having a pitch greater than the wordline pitch, each conductive stripe of the second plurality overlying a respective even numbered row of the storage cells and connecting to the wordline interconnecting the gate electrodes of the respective even numbered row.

2. A semiconductor memory device, in accordance with claim 1, wherein:
   each wordline is polycrystalline silicon.

3. A semiconductor memory device, in accordance with claim 2, further comprising:
   a first conductive path interconnecting each respective conductive stripe of the first plurality of conductive stripes to the wordline of the respective odd numbered row.

4. A semiconductor memory device, in accordance with claim 3, wherein:
   a second conductive path interconnects each respective conductive stripe of the second plurality of conductive stripes to the wordline of the respective even numbered row.

5. A semiconductor memory device, in accordance with claim 4, wherein:
   a pitch of the first plurality of conductive stripes is approximately equal to twice the pitch of the wordlines; and
   the pitch of the second plurality of conductive stripes is approximately equal to twice the pitch of the wordlines.

6. A semiconductor memory device comprising:
   a first row of memory cells, each memory cell of the first row including a transistor having an electrode;
   a first conductor interconnecting the electrodes of the first row of memory cells;
   a second row of memory cells adjacent the first row of memory cells, the second row having a row pitch with respect to the first row, each memory cell of the second row including a transistor having an electrode; and
   a second conductor interconnecting the electrodes of the second row of memory cells, the second conductor having a pitch with respect to an adjacent second conductor that is greater than the row pitch.

7. A semiconductor memory device, as in claim 6, wherein the second conductor comprises a different material than the first conductor.

8. A semiconductor memory device, as in claim 6, wherein the electrodes are gate electrodes.

9. A semiconductor memory device, as in claim 8, further comprising:
   a first wordline interconnecting the gate electrodes of the first row of memory cells, the first wordline connected to the first conductor through an opening in an insulating layer; and
   a second wordline interconnecting the gate electrodes of the second row of memory cells, the second wordline connected to the second conductor through another opening in the insulating layer.

10. A semiconductor memory device as in claim 9 wherein each of the first and second wordlines comprises polycrystalline silicon.

11. A semiconductor memory device as in claim 10 wherein each of the first and second wordlines comprises segments of polycrystalline silicon, each segment separately connected to the respective conductor.

12. A semiconductor memory device, as in claim 6, wherein the electrodes are source or drain electrodes of the transistor.

13. A semiconductor memory device, as in claim 12, further comprising: A
   a first bitline interconnecting the electrodes of the first row of memory cells, the first bitline connected to the first conductor through an opening in an insulating layer; and
   a second bitline interconnecting the electrodes of the second row of memory cells, the second bitline connected to the second conductor through another opening in the insulating layer.

14. A semiconductor memory device as in claim 6, further comprising:
   a first plurality of wordline segments, each wordline segment of the first plurality interconnecting a plurality of transistor electrodes of the first row of memory cells, each wordline segment of the first plurality coupled to the first conductor by a separate selection circuit; and a second plurality of wordline segments, each wordline segment of the second plurality interconnecting a plurality of transistor electrodes of the second row of memory cells, each wordline segment of the second plurality coupled to the second conductor by a separate selection circuit.

15. A semiconductor memory device as in claim 14 wherein each selection circuit selectively activates the respective wordline segment responsive to an address signal and another signal applied to the respective conductor.

16. A semiconductor memory device as in claim 6, wherein the first conductor has a pitch with respect to an adjacent first conductor that is greater than the row pitch.

17. A semiconductor memory device as in claim 16, wherein the pitch of each of the first and second conductor is approximately twice the row pitch.

* * * * *